(12) United States Patent
Liston et al.

(10) Patent No.: US 7,706,207 B2
(45) Date of Patent: *Apr. 27, 2010

(54) MEMORY WITH LEVEL SHIFTING WORD LINE DRIVER AND METHOD THEREOF

(75) Inventors: Thomas W. Liston, Austin, TX (US); Shahnaz P. Chowdhury-Nagle, Austin, TX (US); Perry H. Pelley, III, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/209,477

(22) Filed: Sep. 12, 2008

(65) Prior Publication Data

US 2009/0021990 A1 Jan. 22, 2009

Related U.S. Application Data

(63) Continuation of application No. 11/433,998, filed on May 15, 2006, now Pat. No. 7,440,354.

(51) Int. Cl.
*G11C 8/00* (2006.01)
(52) U.S. Cl. ............ 365/230.03; 365/189.11; 365/63
(58) Field of Classification Search ............ 365/230.06, 365/63, 189.11
See application file for complete search history.

(56) References Cited

U.S. PATENT DOCUMENTS

| | | | |
|---|---|---|---|
| 6,009,023 A | 12/1999 | Lu et al. | |
| 6,069,838 A * | 5/2000 | Jeong | 365/230.06 |
| 6,195,306 B1 | 2/2001 | Horiguchi et al. | |
| 6,198,685 B1 | 3/2001 | Sudo et al. | |
| 6,269,046 B1 | 7/2001 | Lee et al. | |
| 6,925,025 B2 | 8/2005 | Deng et al. | |
| 7,064,984 B2 | 6/2006 | Pekny | |
| 7,242,626 B2 | 7/2007 | Ramaraju et al. | |
| 2001/0001598 A1 | 5/2001 | Narui et al. | |
| 2002/0031032 A1 | 3/2002 | Ooishi | |
| 2003/0052371 A1 | 3/2003 | Matsuzaki et al. | |
| 2004/0104756 A1 | 6/2004 | Payne | |
| 2005/0018471 A1 | 1/2005 | Arimoto et al. | |
| 2005/0023594 A1 | 2/2005 | Ahn et al. | |
| 2005/0083100 A1 | 4/2005 | Tseng et al. | |

OTHER PUBLICATIONS

Bellaouar, A. et al.; "Low-Power Digital VLSI Design Circuits and Systems"; 1995; pp. 388-391; Kluwer Academic Publishers; Norwell, Massachusetts.
"Engineering Report on the Sharp LH28FHT-PBTL75A 128Mb Flash Memory"; Oct. 2006; pp. 32, 49, 50 and 148.
International Search Report for PCT/US07/64583, issued Feb. 12, 2008.
Actions on the Merits by the USPTO as of May 12, 2009, 1 page.

* cited by examiner

*Primary Examiner*—Huan Hoang

(57) ABSTRACT

A memory includes a bit cell array including a plurality of word lines and address decode circuitry having an output to provide a predecode value. The address decode circuitry includes a first plurality of transistors having a first gate oxide thickness. The memory further includes word line driver circuitry having an input coupled to the output of the address decode circuitry and a plurality of outputs, each output coupled to a corresponding word line of the plurality of word lines. The word line driver includes a second plurality of transistors having a second gate oxide thickness greater than the first gate oxide thickness. A method of operating the memory also is provided.

13 Claims, 4 Drawing Sheets

MEMORY WITH LEVEL SHIFTING WORD LINE DRIVER AND METHOD THEREOF

CROSS-REFERENCE TO RELATED APPLICATIONS

The present application is a continuation of U.S. patent application Ser. No. 11/433,998, entitled "Memory with Level Shifting Word Line Driver and Method Thereof" and filed on May 15, 2006, now U.S. Pat. No. 7,440,354, the entirety of which is incorporated by reference herein.

FIELD OF THE DISCLOSURE

The present disclosure relates generally to memories and more particularly to powering memories.

BACKGROUND

Memories typically are implemented as bit cell arrays accessed via word line drivers, where the word line drivers are activated based on the decoding of row addresses associated with memory accesses. For data reliability and performance reasons, it often is advantageous to operate the bit cell array and the word line drivers at a higher voltage than the peripheral circuitry of the memory. This dual-voltage domain technique also is advantageous in that the peripheral circuitry of the memory can be placed in a low-power mode to reduce leakage current without disturbing the voltage supply to the bit cell array, thereby allowing the bit cell array to retain stored data.

The use of dual voltage domains typically requires the use of voltage level shifters between the peripheral circuitry and the word line drivers and bit cell array. Conventional level shifting implementations typically require a relatively large substrate area, thereby inhibiting their use in a memory topology having a relatively small memory cell pitch, particularly in memory cell topologies utilizing hierarchical word line decoding. These conventional level shifting implementations also typically implement relatively slow circuitry, which, being in the critical path between the peripheral circuitry and the word lines, impedes the performance of memory accesses. Accordingly, an improved technique for voltage level shifting in a multiple-voltage-domain memory would be advantageous.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

Figure 1:
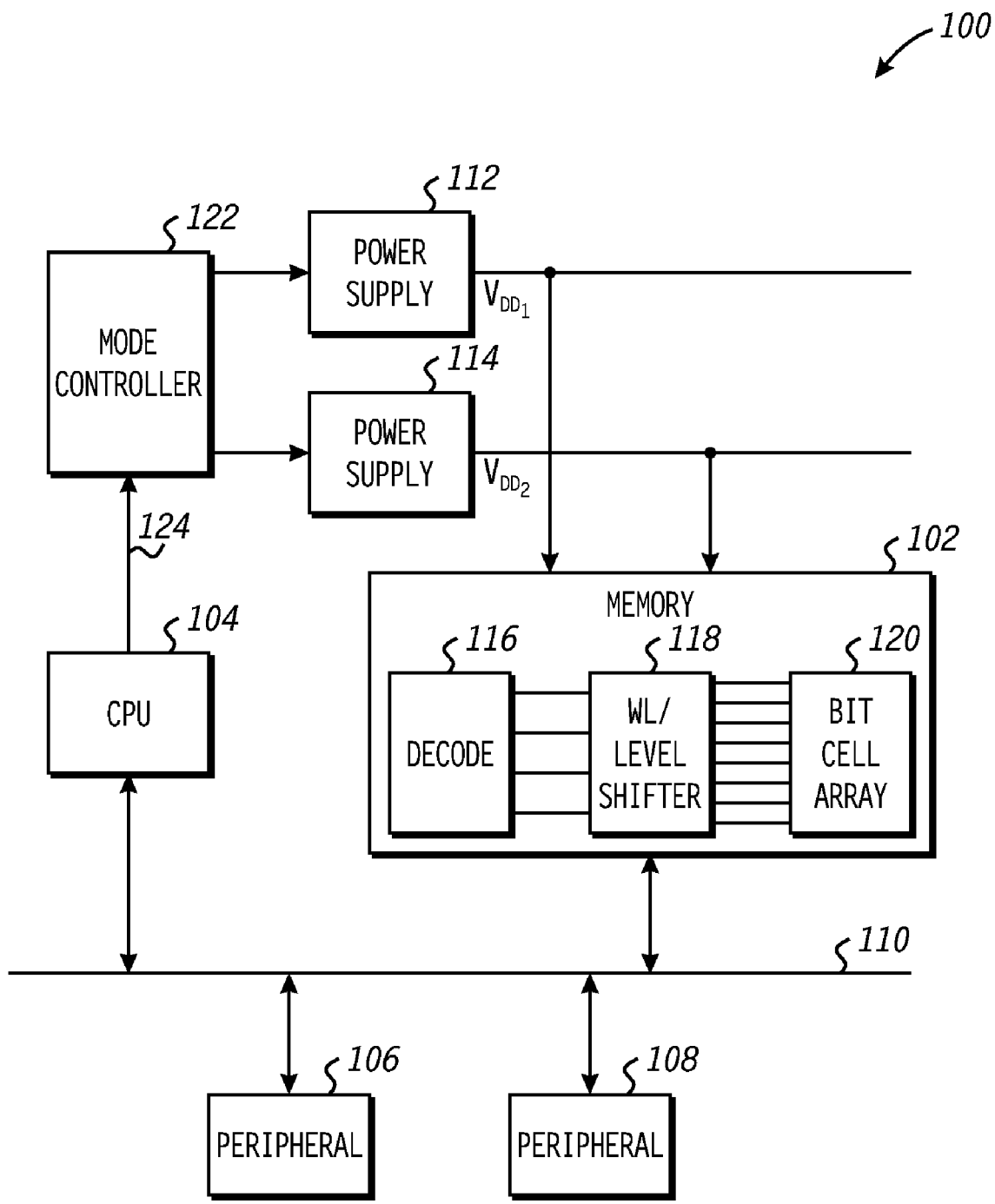
FIG. 1 is a block diagram illustrating an exemplary processing system utilizing a multiple voltage domain memory in accordance with at least one embodiment of the present disclosure.

In accordance with one aspect of the present disclosure, a word line driver has a first input to receive a first predecode value, a second input to receive a second predecode value, and an output coupled to a word line of a memory. The word line driver includes a first transistor having a gate electrode coupled to the first input, a first current electrode coupled to the second input, and a second current electrode coupled to a first node, and a second transistor having a gate electrode coupled to a first voltage reference, a first current electrode coupled to a second voltage reference, and a second current electrode coupled to the first node. The word line driver further includes a third transistor having a gate electrode coupled to the first node, a first current electrode coupled to a third voltage reference, and a second current electrode coupled to a second node. The second node is coupled to a word line of a memory. The word line driver also includes a fourth transistor having a gate electrode coupled to the first node, a first current electrode coupled to the second node, and a second current electrode coupled to the first voltage reference.

In accordance with another aspect of the present disclosure, a memory includes a plurality of global word lines and global word line driver circuitry having a plurality of outputs. Each output is coupled to a corresponding global word line of the plurality of global word lines. The memory further includes address decode circuitry having an output to provide a predecode value and a local bit cell array including a plurality of local word lines. The memory additionally includes local word line driver circuitry having an input coupled to the output of the address decode circuitry, an input coupled to corresponding global word line of the plurality of global word lines, and a plurality of outputs. Each output is coupled to a corresponding local word line of the plurality of local word lines. The local word line driver circuitry includes a plurality of voltage level shifters, each voltage level shifter associated with a corresponding local word line of the local bit cell array. The global word line driver circuitry and address decode circuitry are operable in a first voltage domain and the local bit cell array and local word line driver circuitry are operable in a second voltage domain different than the first voltage domain.

In accordance with another aspect of the present disclosure, a method is provided for a memory including address decode circuitry operable at a first voltage and including word line driver circuitry and a bit cell array operable at a second voltage. The memory includes providing the first voltage to the address decode circuitry and providing the second voltage to the word line driver circuitry and the bit cell array in an active mode. The method also includes providing a third voltage to the address decode circuitry, wherein the address decode circuitry is substantially inoperable at the third voltage and providing a fourth voltage to bit cell array in a low power mode. The bit cell array is operable to retain stored data at the fourth voltage.

FIGS. 1-5 illustrate exemplary techniques for utilizing voltage level shifting (hereinafter, "level shifting") in a memory device having multiple voltage levels. In accordance with at least one embodiment, the memory includes peripheral circuitry, such as address decode circuitry, operated in a first voltage domain and a bit cell array and word line drivers operated in a second voltage domain, where the peripheral circuitry can be shut-down or placed in a low-power state by reducing or shutting off the voltage to the first voltage domain while maintaining a voltage at the second voltage domain for data retention purposes. As the second voltage domain can be operated at a voltage greater than the voltage supplied to the first voltage domain, the word line drivers can implement voltage level shifters (hereinafter, "level shifters") to facilitate interfacing between the first voltage domain and the second voltage domain. In one embodiment, the transistors of the peripheral circuitry are implemented using a first gate oxide thickness and the transistors of the word line drivers (including the level shifters) and the transistors of the bit cell array are implemented using a second gate oxide thickness that is greater than the first gate oxide thickness. Thus, the transistors of the peripheral circuitry can operate faster and at a lower voltage than the transistors of the word line drivers and the bit cell arrays. The use of a thicker gate oxide for transistors of the bit cell array also reduces leakage current in these transistors at the higher voltage supplied to the second voltage domain.

Referring to FIG. 1, an exemplary processing system 100 is illustrated in accordance with at least one embodiment of the present disclosure. The processing system 100 can include, for example, a microprocessor or microcontroller, and may be implemented as a single integrated circuit device, such as, for example, a system-on-a-chip (SOC) or an application-specific integrated circuit (ASIC). Alternately, the processing system 100 can be implemented as a plurality of separate integrated circuit devices.

In the depicted example, the processing system 100 includes a memory 102 (e.g., a random access memory (RAM)) having two voltage domains, a central processing unit (CPU) 104 and one or more peripheral components (e.g., peripheral components 106 and 108) connected via one or more busses 110. The processing system 100 further includes a power supply 112 to provide a voltage $V_{DD1}$ (e.g., approximately 0.9 volts) for a first voltage domain of the processing system 100 and a power supply 114 to provide a voltage $V_{DD2}$ (e.g., approximately 1.2 volts) for a second voltage domain of the processing system 100 when the processing system 100 is in an active mode. In one embodiment, the power supply 112 and the power supply 114 are a single power supply.

The memory 102 includes peripheral circuitry, such as address decode circuitry 116, operated in the first voltage domain. The memory 102 also includes word line driver circuitry 118 and a bit cell array 120 operated in the second voltage domain. As described in greater detail herein, the operational voltages of the first voltage domain and the second voltage domain differ (e.g., the operational voltage of the second voltage domain is higher than the operational voltage of the first voltage domain). Accordingly, the word line driver circuitry 118 implements level shifting circuitry to facilitate interfacing between the two different voltages of the first and second voltage domains.

To enable the memory 102 to operate over two or more voltage domains, the transistors implemented in the components of the first voltage domain, such as the transistors of the address decode circuitry 116, utilize a first gate oxide thickness and the transistors implemented in the components of the second voltage domain, such as the transistors of the word line driver circuitry 118 and the bit cell array 120, utilize a second gate oxide thickness. In at least one embodiment, the second gate oxide thickness is greater than the first gate oxide thickness. For example, the first gate oxide thickness can be less than 14 angstroms and the second gate oxide thickness can be less than 19 angstroms. Example gate oxide materials can include silicon dioxide, silicon nitride, and the like.

It will be appreciated that transistors having a thicker gate oxide typically have a greater minimum operational voltage than transistors having a thinner gate oxide. Conversely, transistors having a thicker gate oxide typically experience less leakage current than transistors having a thinner gate oxide. Accordingly, in one embodiment, the second voltage domain is supplied with a higher operational voltage than the first voltage domain (i.e., $V_{DD2} > V_{DD1}$) while the memory 102 is in an active mode so that the transistors of the peripheral circuitry, the word line driver circuitry 118 and the bit cell array 120 all are operational. In a low-voltage mode (e.g., a sleep mode), the second voltage domain is supplied with a voltage sufficient for data retention purposes at the bit cell array 120 and the transistors of the peripheral circuitry (e.g., the address decode circuitry 116) are placed in an inoperative state by supplying a voltage to the first voltage domain that is less than the threshold voltage of the transistors of the peripheral components (e.g., by supplying zero volts). As a result, power can be conserved by effectively shutting down the peripheral circuitry of the memory 102 during inactive periods while maintaining the data in the bit cell array 120. In an alternate embodiment, the second voltage domain is supplied with a lower operational voltage than the first voltage domain (i.e., $V_{DD2} < V_{DD1}$).

In order to implement the different modes of operation, the processing system 100 includes a mode controller 122 to control the power supplies 112 and 114 in response to a mode select signal 124 provided by the CPU 104, where the mode select signal 124 can be used to indicate whether the memory 102 is to enter the active mode or the low-voltage mode. In response to the mode select signal 124 indicating the active mode, the mode controller 122 directs power supply 112 to provide the $V_{DD1}$ voltage and the power supply 114 to provide the $V_{DD2}$ voltage, thereby maintaining the peripheral circuitry of the first voltage domain and the word line driver circuitry 118 and the bit cell array 120 of the second voltage domain in operative states. In response to the mode select signal 124 indicating the low voltage mode, the mode controller 122 directs the power supply 112 to provide a voltage lower than $V_{DD1}$ and lower than the threshold voltage of the transistors of the peripheral circuitry (e.g., provide zero volts) and directs the power supply 114 to continue to provide the $V_{DD2}$ voltage. As a result, the periphery circuitry of the memory 102 is effectively disabled while the bit cell array 120 continues to retain the stored data.

Figure 2:
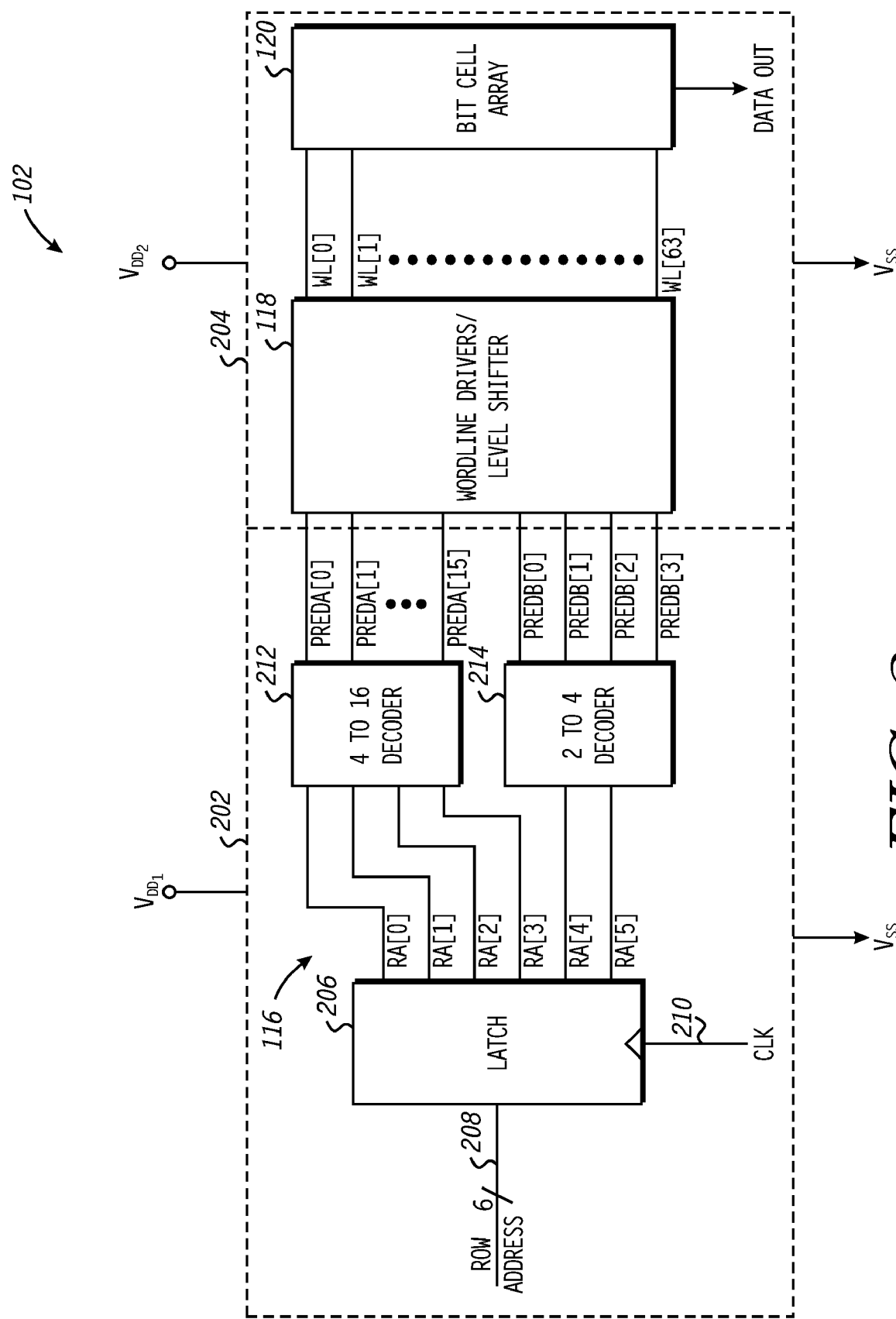
FIG. 2 is a block diagram illustrating an exemplary implementation of the multiple voltage domain memory of FIG. 1 in accordance with at least one embodiment of the present disclosure.

Referring to FIG. 2, an exemplary implementation of the memory 102 of FIG. 1 is illustrated in accordance with at least one embodiment of the present disclosure. The memory 102 includes the address decode circuitry 116 operated in the voltage domain 202 (receiving voltage $V_{DD1}$ during an active mode). The memory 102 further includes the word line driver circuitry 118 (including level shifting circuitry) and the bit cell array 120 operated in the voltage domain 204 (receiving voltage $V_{DD2}$ during an active mode).

In the depicted implementation, the address decode circuitry 116 includes a latch 206 having a first input to receive a row address value 208, a second input to receive a clock signal 210, and a plurality of outputs, each output providing a latched representation of a corresponding bit value of the row address value 208 responsive to the clock signal 210. For purposes of illustration, it is assumed that the row address value 208 is a six bit value (bits RA[0]-RA[5]) and the latch 206 therefore provides latched output bits RA[0]-RA[5].

The address decode circuitry 116 further includes a decoder 212 and a decoder 214, where the decoder 212 has inputs to receive a first subset of the bit values of the latched row address value 208 and the decoder 214 has input to receive a second subset of the bit values of the latched row address value 208. The first and second subsets can be mutually exclusive or may overlap. The decoder 212 has a plurality of outputs, each output providing a corresponding bit of a first predecode value (PredA) determined by the decoder 212 based on the first subset of bit values. The decoder 214 has a plurality of outputs, each output providing a corresponding bit of a second predecode value (PredB) determined by the decoder 214 based on the second subset of bit values. In the illustrated example, the decoder 212 includes a 4-to-16 decoder having four inputs to receive bits RA[0]-RA[3] of the latched row address value 208 and sixteen outputs to provide sixteen bits for PredA (i.e., PredA[0]-PredA[15]). Further, in this example the decoder 214 includes a 2-to-4 decoder having two inputs to receive bits RA[4] and RA[5] and four outputs to provide four bits for PredB (i.e., PredB[0]-PredB[3]).

In the depicted example, the word line driver circuitry 118 includes a first set of inputs connected to the outputs of the decoder 212 to receive the corresponding bit values for PredA[0]-PredA[15] and a second set of inputs connected to the decoder 214 to receive the corresponding bit values for PredB[0]-PredB[3]. The word line driver circuitry 118 further includes a plurality of outputs that are connected to the word lines of the bit cell array 120, where the particular word line is asserted by the word line driver circuitry 118 during any given access cycle is determined based on a final decode of the bits PredA[0]-PredA[15] and PredB[0]-PredB[3] received at the word line driver circuitry 118. In the illustrated example, the word line driver circuitry 118 is connected to sixty-four word lines (WL0-WL63) of the bit cell array 120.

As noted above, the transistors of the address decode circuitry 116 are implemented using a thinner gate oxide so that the address decode circuitry 116 can be operable at a lower voltage for $V_{DD1}$ and the transistors of the word line driver circuitry 118 and the bit cell array 120 are implemented using a thicker gate oxide so that the word line driver circuitry 118 and the bit cell array 120 are operable at a higher voltage (as well as being less susceptible to leakage current). However, as the voltage $V_{DD2}$ provided to the word line driver circuitry 118 and the bit cell array 120 can be higher than the voltage $V_{DD1}$ provided to the address decode circuitry 116 to take advantage of the benefits of the different transistor voltage and leakage characteristics, a voltage difference is present between the outputs of the decoders 212 and 214 and the voltages at which the word lines WL0-WL63 are operated. Accordingly, the word line driver circuitry 118 implements level shifters for each of the word lines WL0-WL63. Exemplary implementations of a word line driver of the word line driver circuitry 118 for a corresponding word line are illustrated in greater detail with reference to FIGS. 3 and 4.

Figure 3:
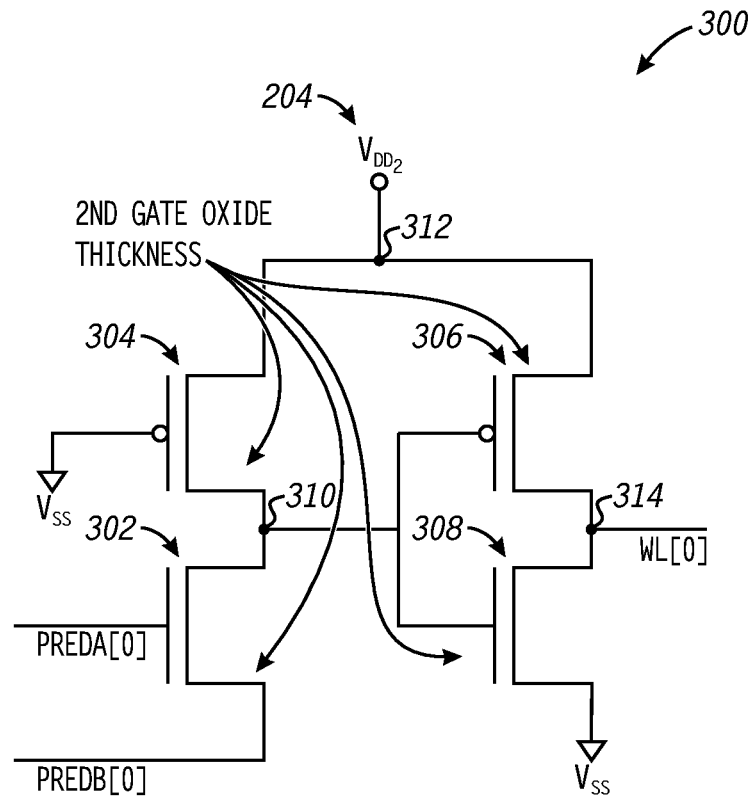
FIG. 3 is a circuit diagram illustrating an exemplary word line driver implementing voltage level shifting in accordance with at least one embodiment of the present disclosure.

Referring to FIG. 3, an exemplary implementation of a word line driver 300 utilized to drive a corresponding word line (e.g., WL0) of the bit cell array 120 (FIG. 2) is illustrated in accordance with at least one embodiment of the present disclosure. In the depicted example, the word line driver 300 includes transistors 302, 304, 306, and 308, where the transistors 302 and 308 are n-channel transistors (e.g., n-channel field effect transistors or NFETs) and the transistors 304 and 306 are p-channel transistors (e.g., p-channel field effect transistors or PFETs). As noted above, the transistors 302, 304, 306 and 308 are implemented using a gate oxide thickness that greater than the gate oxide thickness of the transistors of the periphery circuitry (e.g., the address decode circuitry 116) of the memory 102 (FIG. 2), thereby requiring the transistors 302, 304, 306 and 308 to have a higher operational voltage but resulting in less leakage current.

The transistor 302 includes a gate electrode to receive a corresponding bit value of PredA (e.g., PredA[0]), a first current electrode to receive a corresponding bit value of PredB (e.g., PredB[0]), and a second current electrode connected to a node 310. The transistor 304 includes a gate electrode connected to the voltage reference $V_{SS}$ (or ground), a first current electrode connected to the node 310, and a second current electrode connected to a node 312, where the node 312 is connected to receive voltage from the second voltage domain 204 (e.g., voltage $V_{DD2}$ in an active mode). The transistor 306 includes a gate electrode connected to the node 310, a first current electrode connected to the node 312, and a second current electrode connected to a node 314, where the node 314 is connected to the corresponding word line (e.g., WL0) of the bit cell array 120 (FIG. 2). The transistor 308 includes a gate electrode connected to the node 310, a first current electrode connected to the node 314, and a second current electrode connected to the voltage reference $V_{SS}$ (e.g., ground).

In operation, the output voltage of the node 314, and thus the word line WL0, is dependent on the PredA[0] and PredB[0] bit values. The transistor 302 acts as a final decode of PredA and PredB in that when the corresponding bit of each of PredA and PredB assigned to the word line driver 300 are asserted (PredA[0] and PredB[0] in the illustrated example), the node 310 is pulled to a lower voltage potential and node 314 is pulled to substantially the same voltage potential as node 312, thereby resulting in the assertion of the word line WL0. Otherwise, if either of the corresponding bits are unasserted, the node 310 is pulled to a voltage potential substantially equal to the voltage $V_{DD2}$, thereby causing the node 314 to be pulled to a voltage potential substantially equal to the voltage $V_{SS}$, which results in the word line WL0 being unasserted.

As illustrated, the word line driver 300 implements level shifting in that the input signals (e.g., PredA[0] and PredB[0]) are based on the lower voltage $V_{DD1}$ of the voltage domain 202 (FIG. 2), whereas the output of the word line driver 300 drives the corresponding word line based on the higher voltage $V_{DD2}$ of the voltage domain 204 (FIG. 2). Due to the relatively low number of transistors used to implement both the final decoding of the PredA and PredB value and to drive the corresponding word line, the word line driver 300 can be utilized in memories having relatively small pitches.

Figure 4:
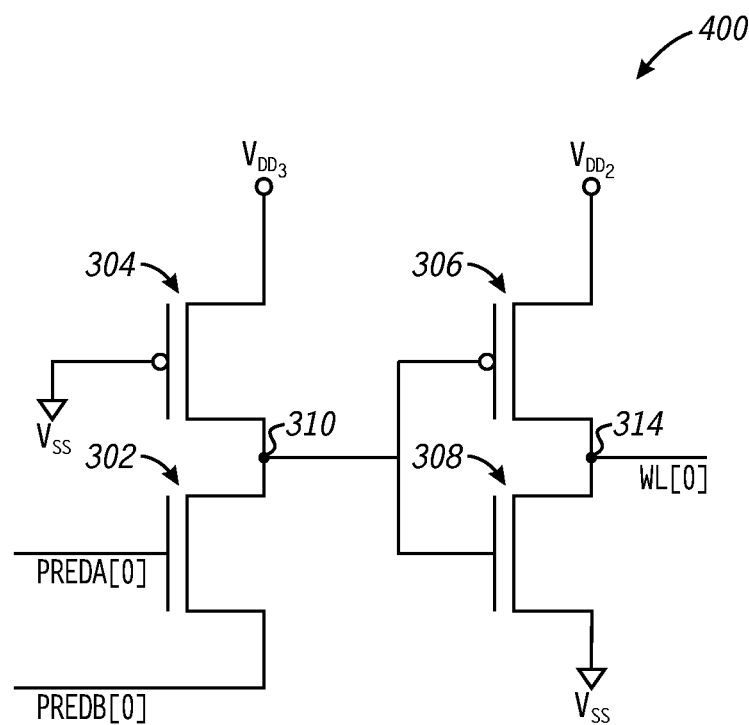
FIG. 4 is a circuit diagram illustrating another exemplary word line driver implementing voltage level shifting in accordance with at least one embodiment of the present disclosure.

Referring to FIG. 4, an alternate implementation of a word line driver 400 is illustrated in accordance with at least one embodiment of the present disclosure. The word line driver 400 includes the transistors 302, 304, 306 and 308 connected as described above with respect to the word line 300 of FIG. 3, except that the second current electrode of the transistor 304 is connected to a third voltage domain having voltage $V_{DD3}$, such that the word line driver 400 can shift between the more than two voltage domains, thereby allowing voltage $V_{DD2}$ to be reduced to a voltage potential substantially equivalent to the voltage $V_{SS}$ during a low-power mode, which reduces current leakage in the word line driver 400 while in the low-power mode.

Figure 5:
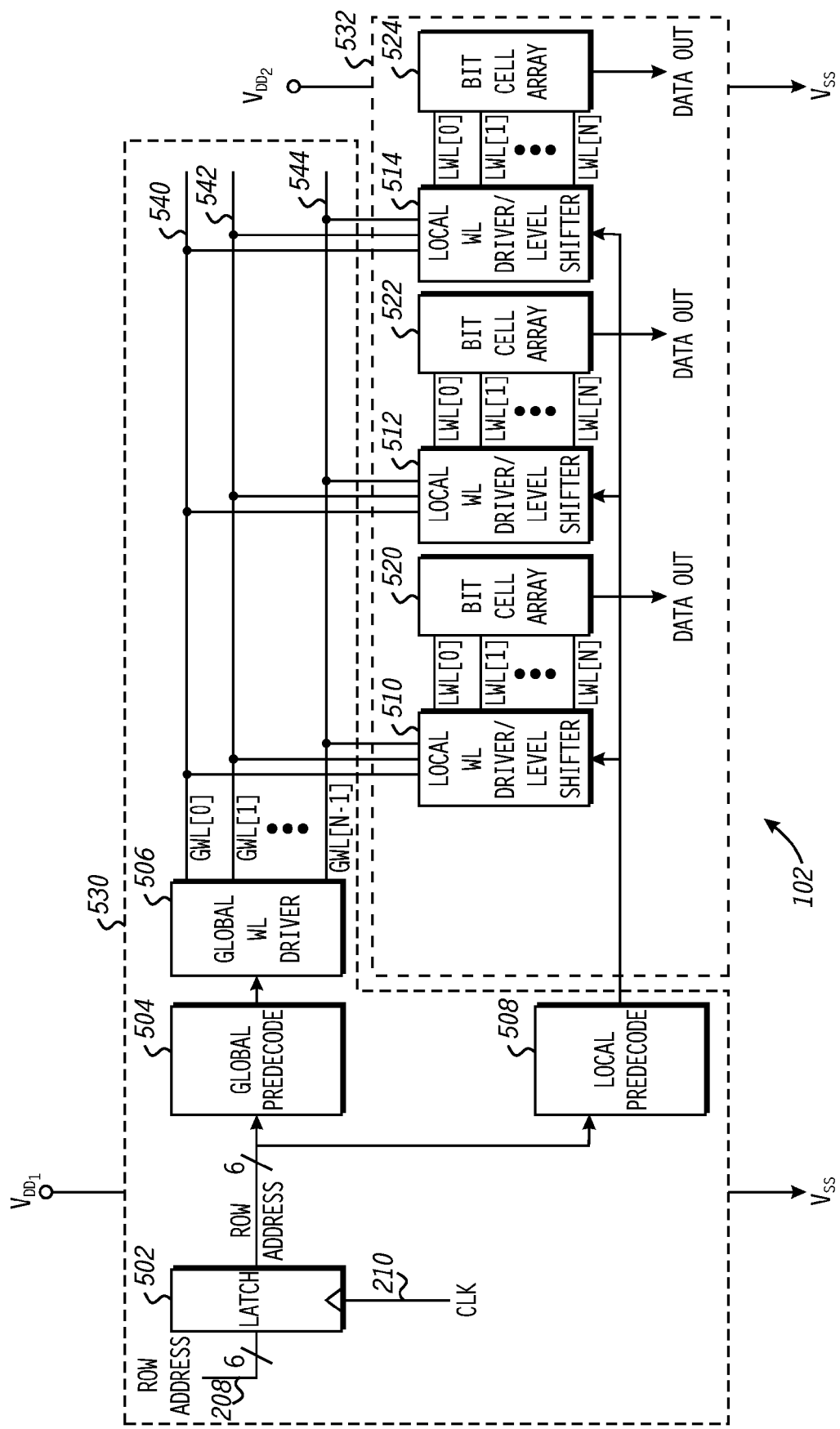
FIG. 5 is a block diagram illustrating another exemplary implementation of the multiple voltage domain memory of FIG. 1 in accordance with at least one embodiment of the present disclosure.

Referring to FIG. 5, another exemplary implementation of the memory 102 of FIG. 1 is illustrated in accordance with at least one embodiment of the present disclosure. In the depicted example, the memory 102 includes a latch 502, global predecode circuitry 504, a global word line driver circuitry 506, local predecode circuitry 508, a plurality of local word line driver circuitries (including level shifting circuitry), such as local word line drivers 510, 512, and 514, and a plurality of local bit cell arrays, such as local bit cell arrays 520, 522, and 524. The latch 502, the global predecode circuitry 504, the global write line driver 506 and the local predecode circuitry 508 are operated in a voltage domain 530 (operating voltage $V_{DD1}$). The local word line drivers 510, 512, and 514 and the local bit cell arrays 520, 522 and 524 are operated in a voltage domain 532 (operating voltage $V_{DD2}$).

In the depicted implementation, the latch 502 includes a first input to receive the row address value 208, a second input to receive the clock signal 210, and a plurality of outputs, each output providing a latched representation of a corresponding bit value of the row address value 208 responsive to the clock signal 210. For purposes of illustration, it is assumed that the row address value 208 is a six bit value and the latch 502 therefore provides six latched output bits.

The global predecode circuitry 504 includes an input to receive the latched row address bits and an output to provide a first set of predecode bit values (e.g., PredA) based on the latched row address bits. Likewise, the local predecode circuitry 508 includes an input to receive the latched row address bits and an output to provide a second set of predecode bit values (e.g., PredB) based on the latched row address bits.

The global word line driver circuitry 506 includes an input connected to the output of the global predecode circuitry 504 to receive the first set of predecode bit values. The global word line driver circuitry 506 further includes a plurality of outputs, each output connected to a corresponding global word line (e.g., global word lines 540, 542, and 544), where a particular global word line is asserted by the global word line driver circuitry 506 during any given access cycle based on the values of the first set of predecode bits received at the global word line driver circuitry 506. In the illustrated example, the global word line driver circuitry 506 is connected to N global word lines (GWL[0]-GWL[N−1]).

Each of the local word line driver circuitries includes a first input connected to a corresponding global word line and a second input connected to the local predecode circuitry 508 to receive the second set of predecode bits. Each of the local word line driver circuitries further includes a plurality of outputs, each output connected to a corresponding local word line of the corresponding local bit cell array, where the particular local word line is asserted by a local word line driver circuitry during any given access cycle is based on the values of the second set of predecode bits and further based on which of the global word lines is asserted by the global word line driver circuitry 506. To illustrate, the local word line driver circuitry 510 includes an input connected to GWL[0] and a plurality of outputs connected to the N local word lines (LWL[0]-LWL[N−1]) of the local bit cell array 520, the local word line driver circuitry 512 includes an input connected to GWL[1] and a plurality of outputs connected to the N local word lines (LWL[0]-LWL[N−1]) of the local bit cell array 522, and the local word line driver circuitry 514 includes an input connected to GWL[N−1] and a plurality of outputs connected to the N local word lines (LWL[0]-LWL[N−1]) of the local bit cell array 524.

As noted above, the latch 502, the global predecode circuitry 505, the global write line driver circuitry 506 and the local predecode circuitry 508 are operated in a different voltage domain than the local word line driver circuitries and the local bit cell arrays. Accordingly, the transistors of the circuitry operated in the voltage domain 530 are implemented using a thinner gate oxide so the circuitry of the voltage domain 530 can be operated at a lower voltage for $V_{DD1}$, whereas the transistors of the circuitry operated in the voltage domain 532 are implemented using a thicker gate oxide so that the circuitry of the voltage domain 532 can be operable at a higher voltage (as well as being less susceptible to leakage current). However, as the voltage $V_{DD2}$ provided to the local word line driver circuitries and the local bit cell arrays is greater than the voltage $V_{DD1}$ supplied to the peripheral circuitry to take advantage of the benefits of the different transistor voltage and leakage characteristics, a voltage difference is present between the voltage level of the output of the local predecode 508 and the global word lines and the voltage level that the local word line driver circuitries drive onto a local word line. Accordingly, the local word line driver circuitries implement level shifters for each of the local word lines LWL[0]-LWL[N−1]. Exemplary implementations of a word line driver of the word line driver circuitries for a corresponding word line were illustrated in greater detail with reference to FIGS. 3 and 4. In these implementations, the input value from the corresponding global word line can serve as the input to either the gate electrode or the first current electrode of the transistor 302 (FIGS. 3 and 4), while the corresponding predecode bit value from the local predecode circuitry 508 serves as the input to the other of the gate electrode or the first current electrode of the transistor 302.

It will be appreciated that the use of local word line drivers partitions an array of bit cells into blocks and allows only a fraction of the cells along the global word line to be selected. By enabling the selection of fewer cells, less power is consumed by the memory. Further, the global word line driver can be implemented in the domain of $V_{DD1}$ using transistors having a thinner gate oxide thickness, which increases the speed of the transistors and permits a lower operational voltage, thereby improving the speed and power consumption of the memory.

Other embodiments, uses, and advantages of the disclosure will be apparent to those skilled in the art from consideration of the specification and practice of the disclosure disclosed herein. To illustrate, although exemplary voltages and gate oxide thicknesses have been described herein, these values are exemplary only and alternate embodiments may have any number of voltage domains, any number of different voltage levels, and any number of different gate thicknesses. The specification and drawings should be considered exemplary only, and the scope of the disclosure is accordingly intended to be limited only by the following claims and equivalents thereof.

What is claimed is:

1. A circuit device comprising:
   a word line driver having a first input to receive a first predecode value, a second input to receive a second predecode value, and an output coupled to a word line of a memory, the word line driver comprising:
     a first transistor having a gate electrode coupled to the first input, a first current electrode coupled to the second input, and a second current electrode coupled to a first node;
     a second transistor having a gate electrode coupled to a first voltage reference, a first current electrode coupled to a second voltage reference, and a second current electrode coupled to the first node;
     a third transistor having a gate electrode coupled to the first node, a first current electrode coupled to a third voltage reference, and a second current electrode coupled to a second node;
     a fourth transistor having a gate electrode coupled to the first node, a first current electrode coupled to the second node, and a second current electrode coupled to the first voltage reference; and
     wherein the second node is coupled to the word line.

2. The circuit device of claim 1, wherein the first transistor and fourth transistor comprise n-channel transistors.

3. The circuit device of claim 2, wherein the second transistor and third transistor comprise p-channel transistors.

4. The circuit device of claim 1, further comprising:
address decode circuitry having a first output coupled to the first input of the word line driver to provide the first predecode value and a second output coupled to the second input of the word line driver to provide the second predecode value.

5. The circuit device of claim 4, wherein the address decode circuitry comprises transistors having a first gate oxide thickness and the first transistor, the second transistor, third transistor and fourth transistor have a second gate oxide thickness greater than the first gate oxide thickness.

6. The circuit device of claim 5, wherein the address decode circuitry is operable at a first voltage and the word line driver is operable at a second voltage greater than the first voltage.

7. The circuit device of claim 6, wherein the first voltage is approximately 0.9 volts and the second voltage is approximately 1.2 volts.

8. The circuit device of claim 1, wherein the second voltage reference is substantially equal to the third voltage reference.

9. A memory comprising:
a plurality of global word lines;
global word line driver circuitry having a plurality of outputs, each output coupled to a corresponding global word line of the plurality of global word lines;
address decode circuitry having an output to provide a predecode value;
a local bit cell array comprising a plurality of local word lines;
local word line driver circuitry having an input coupled to the output of the address decode circuitry, an input coupled to a corresponding global word line of the plurality of global word lines, and a plurality of outputs, each output coupled to a corresponding local word line of the plurality of local word lines, wherein the local word line driver circuitry comprises a plurality of voltage level shifters, each voltage level shifter associated with a corresponding local word line of the local bit cell array;
wherein the global word line driver circuitry and address decode circuitry are operable in a first voltage domain; and
wherein the local bit cell array and local word line driver circuitry are operable in a second voltage domain different than the first voltage domain.

10. The memory of claim 9, wherein each voltage level shifter of the local word line driver circuitry comprises:
a first transistor having a gate electrode coupled to receive one of a corresponding bit value of the predecode value or a value at the corresponding global word line, a first current electrode coupled to receive the other of the corresponding bit value of the predecode value or the value at the corresponding global word line, and a second current electrode coupled to a first node;
a second transistor having a gate electrode coupled to a first voltage reference, a first current electrode coupled to a second voltage reference, and a second current electrode coupled to the first node;
a third transistor having a gate electrode coupled to the first node, a first current electrode coupled to a third voltage reference, and a second current electrode coupled to a second node;
a fourth transistor having a gate electrode coupled to the first node, a first current electrode coupled to the second node, and a second current electrode coupled to the first voltage reference; and
wherein the second node is coupled to the corresponding local word line.

11. The memory of claim 10, wherein the second voltage reference is substantially equal to the third voltage reference.

12. The memory of claim 10, wherein:
the global word line driver circuitry and the address decode circuitry comprise transistors having a first gate oxide thickness; and
the local bit cell array and local word line driver circuitry comprise transistors having a second gate oxide thickness different than the first gate oxide thickness.

13. The memory of claim 12, wherein the first gate oxide thickness is less than 14 angstroms and wherein the second gate oxide thickness is less than 19 angstroms.

* * * * *